United States Patent
Ng et al.

(10) Patent No.: US 10,199,256 B2
(45) Date of Patent: Feb. 5, 2019

(54) METHODS AND SYSTEMS FOR IMPROVED MASK PROCESSING

(71) Applicant: Applied Materials, Inc., Santa Clara, CA (US)

(72) Inventors: Edward Ng, San Jose, CA (US); Jeffrey C. Hudgens, San Francisco, CA (US); Ayan Majumdar, San Jose, CA (US); Sushant S. Koshti, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 653 days.

(21) Appl. No.: 14/499,121

(22) Filed: Sep. 27, 2014

(65) Prior Publication Data
US 2015/0090294 A1    Apr. 2, 2015

Related U.S. Application Data

(60) Provisional application No. 61/884,048, filed on Sep. 28, 2013, provisional application No. 61/884,049, filed on Sep. 28, 2013.

(51) Int. Cl.
*H01L 21/687* (2006.01)
*H01L 21/677* (2006.01)
(Continued)

(52) U.S. Cl.
CPC ....... *H01L 21/68707* (2013.01); *B65H 15/00* (2013.01); *B65H 43/04* (2013.01); *H01L 21/67051* (2013.01); *H01L 21/67225* (2013.01); *H01L 21/67778* (2013.01); *B08B 1/00* (2013.01); *B65H 2301/333* (2013.01); *B65H 2404/651* (2013.01); *B65H 2405/50* (2013.01);
(Continued)

(58) Field of Classification Search
CPC ......... H01L 21/68707; H01L 21/67051; H01L 21/67778; H01L 21/67225; B65H 15/00; B65H 43/04; B65H 2301/333; B65H 2404/651; B65H 2405/50; B65H 2515/716; B65H 2553/20; B08B 1/00
See application file for complete search history.

(56) References Cited

U.S. PATENT DOCUMENTS

| 5,697,751 A | 12/1997 | Takahashi |
| 5,951,770 A | 9/1999 | Perlov et al. |

(Continued)

FOREIGN PATENT DOCUMENTS

JP    09321005    12/1997

OTHER PUBLICATIONS

Rice et al., U.S. Appl. No. 14/495,402 (21215), titled: "Mixed-Platform Apparatus, Systems, and Methods for Substrate Processing," filed Sep. 24, 2014.

(Continued)

*Primary Examiner* — Sharidan Carrillo
(74) *Attorney, Agent, or Firm* — Dugan & Dugan, PC (57) ABSTRACT

In some embodiments, methods and systems are provided for improved handling of lithography masks including loading a mask via a first load port from a first carrier; inverting the mask using a first contact pad; cleaning the mask; inverting the mask using a second contact pad; and unloading the mask via a second load port into a second carrier. Numerous other aspects are provided.

9 Claims, 5 Drawing Sheets

(51) Int. Cl.
*H01L 21/67* (2006.01)
*B65H 15/00* (2006.01)
*B65H 43/04* (2006.01)
*B08B 1/00* (2006.01)

(52) U.S. Cl.
CPC .... *B65H 2515/716* (2013.01); *B65H 2553/20* (2013.01)

(56) References Cited

U.S. PATENT DOCUMENTS

| | | | |
|---|---|---|---|
| 6,275,748 B1 | 8/2001 | Bacchi | |
| 6,287,386 B1 | 9/2001 | Perlov et al. | |
| 6,354,791 B1 | 3/2002 | Wytman | |
| 6,468,353 B1 | 10/2002 | Perlov et al. | |
| 6,499,777 B1 | 12/2002 | Wang | |
| 6,575,737 B1 | 6/2003 | Perlov et al. | |
| 6,874,515 B2 | 4/2005 | Ishihara | |
| 6,916,397 B2 | 7/2005 | Pfeiffer et al. | |
| 7,052,229 B2 | 5/2006 | Berger | |
| 7,572,092 B2 | 8/2009 | Hofmeister | |
| 7,644,968 B2 | 1/2010 | Hirooka | |
| 7,661,921 B2 | 2/2010 | Kim | |
| 7,720,655 B2 | 5/2010 | Rice | |
| 7,833,351 B2 * | 11/2010 | Webb | C23C 16/4583 118/719 |
| 8,226,142 B2 | 7/2012 | Gillespie | |
| 8,403,619 B2 | 3/2013 | Moura | |
| 2003/0082042 A1* | 5/2003 | Woodruff | H01L 21/67259 414/744.5 |
| 2004/0102059 A1* | 5/2004 | Dickinson | H01L 21/67778 438/758 |
| 2005/0072716 A1 | 4/2005 | Quiles et al. | |
| 2006/0258128 A1* | 11/2006 | Nunan | H01J 37/09 438/510 |
| 2008/0199283 A1 | 8/2008 | Mitsuyoshi | |
| 2009/0108544 A1 | 4/2009 | Sico et al. | |
| 2010/0104403 A1 | 4/2010 | Cho | |
| 2010/0178139 A1 | 7/2010 | Sundar | |
| 2011/0020096 A1* | 1/2011 | Mink | H01L 21/67721 414/222.01 |
| 2011/0117512 A1 | 5/2011 | Kamimura | |
| 2011/0121193 A1* | 5/2011 | Braude | B82Y 10/00 250/372 |
| 2011/0142578 A1 | 6/2011 | Kawakami | |
| 2012/0016516 A1 | 1/2012 | Machida | |
| 2012/0308341 A1 | 12/2012 | Ishizawa | |
| 2013/0108406 A1* | 5/2013 | Schaller | B65G 49/00 414/744.3 |
| 2014/0262036 A1 | 9/2014 | Reuter et al. | |
| 2014/0263165 A1 | 9/2014 | Hongkham et al. | |
| 2014/0273487 A1 | 9/2014 | Deshmukh et al. | |
| 2015/0090294 A1* | 4/2015 | Ng | B65H 43/04 134/18 |
| 2015/0090295 A1* | 4/2015 | Ng | B65H 43/04 134/18 |
| 2016/0007412 A1 | 1/2016 | Busche et al. | |
| 2017/0316967 A1* | 11/2017 | Ng | B65H 43/04 |

OTHER PUBLICATIONS

Perlov et al., U.S. Appl. No. 10/193,605, titled: "Method and Apparatus for Improved Substrate Handling", filed Jul. 11, 2002.

Quiles et al, U.S. Appl. No. 14/335,415, titled: "Substrate Processing System, Valve Assembly, and Processing Method," filed Jul. 18, 2014.

Parkhe et al., U.S. Appl. No. 14/085,026 (020566USA), titled: "Electrostatic Chuck With Variable Pixilated Heating," filed Nov. 20, 2013.

Madiwal et al., U.S. Appl. No. 14/036,754 (20873), titled: "Gas Apparatus, Systems, and Methods for Chamber Ports," filed Sep. 25, 2013.

Koshti et al., U.S. Appl. No. 14/456,631 (21149), titled: "Substrate Processing Systems, Apparatus, and Methods With Factory Interface Environmental Controls," filed Aug. 11, 2014.

Busche et al., U.S. Appl. No. 14/299,850 (21770), titled: "Substrate Temperature Control Apparatus Including Optical Fiber Heating, Substrate Temperature Control Systems, Electronic Device Processing Systems, and Methods," filed Jun. 9, 2014.

Ng et al., U.S. Appl. No. 14/498,449 (20841), titled: "Transfer Chamber Gas Purge Apparatus, Electronic Device Processing Systems, and Purge Methods," filed Sep. 26, 2014.

Ng et al., U.S. Appl. No. 14/499,122, titled: "Apparatus and Methods For a Mask Inverter," filed Sep. 27, 2014.

Restriction Requirement of U.S. Appl. No. 14/499,122 dated Mar. 23, 2017.

Apr. 5, 2017 Reply to Mar. 23, 2017 Restriction Requirement of U.S. Appl. No. 14/499,122 dated Mar. 23, 2017.

Non-Final Office Action of U.S. Appl. No. 14/499,122 dated Apr. 19, 2017.

\* cited by examiner

METHODS AND SYSTEMS FOR IMPROVED MASK PROCESSING

The present application claims priority to commonly owned, co-pending U.S. Provisional Patent Application 61/884,048, filed on Sep. 28, 2013, and entitled "APPARATUS AND METHODS FOR A MASK INVERTER," and commonly owned, co-pending U.S. Provisional Patent Application 61/884,049, also filed on Sep. 28, 2013, and entitled "METHODS AND SYSTEMS FOR IMPROVED MASK PROCESSING," which are both hereby incorporated herein by reference in their entirety for all purposes.

FIELD

The present application relates to processing masks, and more specifically to methods and systems for improved handling of masks.

BACKGROUND

Particle contamination can be a significant problem in semiconductor manufacturing. A photomask is typically protected from contaminating particles by a pellicle, a thin transparent film stretched over a frame that is glued over one side of the photomask. The pellicle is far enough away from the mask patterns so that moderate-to-small sized particles that land on the pellicle will be too far out of focus to print. Although they are designed to keep particles away, pellicles become a part of the imaging system and their optical properties effect the lithography and are taken into account.

Conventionally, a pellicle can be used to protect and prevent contamination of the patterned side of ultraviolet (e.g., using 193 nm argon fluorine exciplex lasers) optical lithography masks. However, extreme ultraviolet (EUV) lithography does not allow the use of a pellicle due to the optical effects of the pellicle. However, if the bare mask is not handled properly, there is a risk of contamination.

Thus, EUV masks (without the protection of a pellicle) are typically only handled in a vacuum. For example, a mask carrier with a nested inner carrier that conforms to the SEMI E152 standard provides double isolation of the bare mask for contamination control, with the assumption that the inner carrier will only be opened in a vacuum. However, an inner carrier opener in a vacuum presents significant cost and complexity. Thus, what is needed are methods and systems that facilitate mask handling without requiring nested carriers and vacuum isolation.

SUMMARY

In some embodiments, the invention provides a method of handling a mask. The method includes loading a mask via a first load port from a first carrier; inverting the mask using a first contact pad; cleaning the mask; inverting the mask using a second contact pad; and unloading the mask via a second load port into a second carrier.

In other embodiments, the invention provides an alternative method of handling a mask. The alternative method includes loading a mask via a load port from a first carrier; replacing the first carrier with a second carrier at the load port; inverting the mask using a first contact pad; cleaning the mask; inverting the mask using a second contact pad; and unloading the mask via the load port into the second carrier.

In yet other embodiments, the invention provides a system for handling masks. The system includes a processor; and a memory coupled to the processor and storing program instructions to load a mask via a first load port from a first carrier; invert the mask using a first contact pad; clean the mask; invert the mask using a second contact pad; and unload the mask via a second load port into a second carrier.

Numerous other aspects are provided in accordance with these and other aspects of the invention. Other features and aspects of the present invention will become more fully apparent from the following detailed description, the appended claims and the accompanying drawings.

DETAILED DESCRIPTION

In some embodiments of the present invention, methods and systems are provided for minimizing or reducing the risk of contamination while handling bare EUV masks, particularly at atmospheric conditions. The methods include using a dedicated set of contact pads and end effectors when handling "uncleaned" (e.g., versus post-cleaned) masks within a wet clean tool to prevent re-contamination after cleaning and using a second set of dedicated contact pads and end effectors for handling masks that have been cleaned. Thus, cleaned masks are not handled with contact pads or end effectors that have previously handled masks before the masks were cleaned and masks that have not yet been cleaned are not handled with contact pads or end effectors dedicated to only handling masks that have been cleaned.

In addition, in some embodiments, a dedicated load port is used for unclean masks entering the wet clean tool and a separate dedicated load port is used for post-cleaned masks exiting the wet clean tool. In some embodiments, the same load port is used but different carriers are used for entry and exit. In some embodiments, control software logic is also provided that returns uncleaned masks back to the "unclean" incoming load port and post-cleaned masks to the "clean" outgoing load port in the event of a system fault within the wet clean tool. These and other embodiments provide advantages both in terms of reduced cost and complexity as well as a reduction of contamination of EUV masks which in turn increases yield and output from electronic device manufacturing facilities. In addition to EUV optical mask handling, the systems and methods provided herein can be applied to handling other masks, reticles, and electric device substrates to reduce particle contamination.

Figure 1:
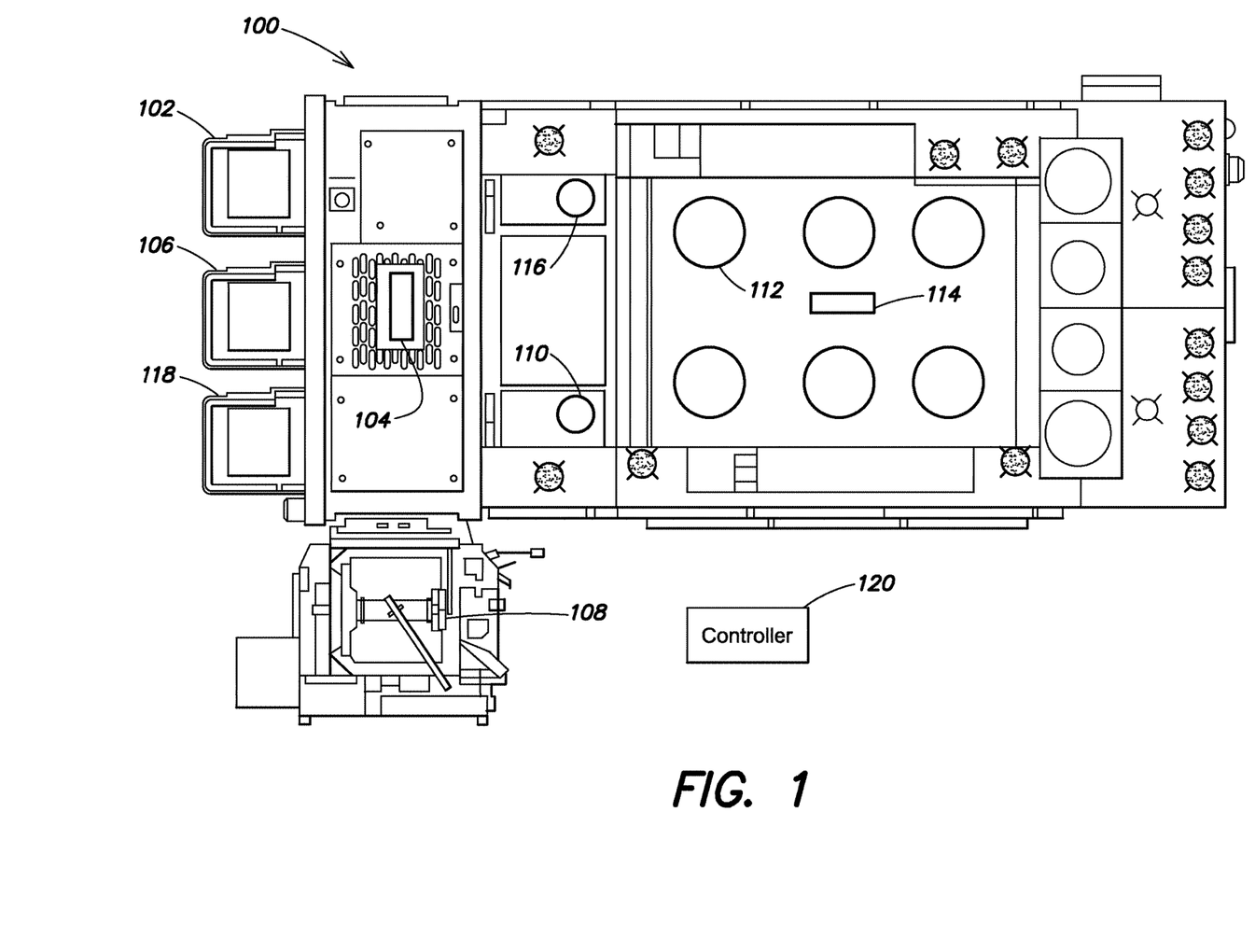
FIG. 1 is a schematic depiction of a first example system for improved mask processing according to some embodiments provided herein.

FIG. 1 is a schematic diagram of a first example system 100 provided in accordance with some embodiments. A first load port 102 is coupled to the factory interface of a mask processing tool such as a mask cleaning tool. The load port 102 is disposed so that an atmospheric dual blade factory interface robot 104 can remove the mask to be cleaned from a carrier placed in the load port 102. Thus, the carrier is opened into a non-vacuum factory interface. The robot 104 includes two end effectors. The first end effector is dedicated to only handling masks that have not yet been cleaned. The second end effector is dedicated to only handing masks that have already been cleaned. Thus, contamination of a mask that has been cleaned is avoided by not handling the clean mask with an end effector that has handled unclean masks.

The inventors of the present application have determined that before a mask is cleaned, potentially contaminating particles are transferable from the unclean mask to the end effector when the mask is moved from the load port. Further, these particles can then be transferred again from the end effector to a subsequently handled mask. If the mask has already undergone a cleaning process, the particle transfer back to the mask from the end effector can contaminate the clean mask. Thus, one or more embodiments provided herein avoid this potential for contamination by only handling a clean mask with end effectors that have not handled unclean masks.

The system 100 further includes a mask inverter 106. In some embodiments, the mask inverter 106 can be disposed at a load port location as shown in FIG. 1. In some embodiments, the mask inverter can be located at any practicable location such as alongside the factory interface or between the tool and the factory interface within the system 100. The mask inverter 106 includes two different contact pads. The first contact pad is dedicated to only handling and inverting masks that have not yet been cleaned. The second contact pad is dedicated to only handing masks that have already been cleaned. Thus, contamination of a mask that has been cleaned is avoided by not handling the clean mask with a contact pad that has held unclean masks.

As with end effectors, the inventors of the present application have determined that before a mask is cleaned, potentially contaminating particles are transferable from the unclean mask to the contact pads of the inverter 106 when the mask is held by the inverter 106. Further, these particles can then be transferred again from the contact pad to a subsequently held mask. If the mask has already undergone a cleaning process, the particle transfer back to the mask from the contact pad can contaminate the clean mask. Thus, one or more embodiments provided herein avoid this potential for contamination by only holding a clean mask with contact pads that have not held unclean masks.

The system 100 can further include a dry clean tool 108 such as an etch process tool for, e.g., removing oxidation from the mask before the mask undergoes wet clean processing. An example of such a tool is the Axiom™ strip chamber manufactured by Applied Materials, Inc. of Santa Clara, Calif.

In some embodiments, the system 100 can include buffer stations 110, 116 within an intermediate module between the factory interface and an atmospheric process module that includes a plurality of mask wet clean chambers 112. The buffer stations 110, 116 provide a location for the factory interface robot 104 and an atmospheric dual blade process robot 114 to facilitate mask handoff. One of the buffer stations 110 is dedicated to holding unclean masks while the other buffer station 116 is dedicated to holding cleaned masks. Thus, contamination of a mask that has been cleaned is avoided by not storing the clean mask on a buffer station that has held unclean masks.

As with end effectors and contact pads, the inventors of the present application have determined that before a mask is cleaned, potentially contaminating particles are transferable from the mask to a buffer station when the unclean mask is held in the buffer station. Further, these particles can then be transferred again from the buffer station to a subsequently held mask. If the mask has already undergone a cleaning process, the particle transfer back to the mask from the buffer station can contaminate the clean mask. Thus, one or more embodiments provided herein avoid this potential for contamination by only holding a clean mask in a buffer station that has not held unclean masks.

In some embodiments, the system 100 can include a second load port 118 coupled to the factory interface. The second load port 118 is disposed so that the atmospheric dual blade factory interface robot 104 can load a cleaned mask into a carrier placed in the load port 118.

In some embodiments, a second load port is not used and instead, cleaned masks exit the system via the first load port 102. In such embodiments, a first carrier that brings the unclean mask to the system 100 is replaced with a second carrier to remove the cleaned mask from the system 100. In other words, after a mask to be cleaned has been removed from the carrier within which the unclean mask arrived, the carrier is removed from the load port 102 and a new carrier that has not stored unclean masks is placed on the load port 102 to receive the clean mask. Therefore, some of the carriers used by the system are dedicated to holding only unclean masks while other carriers are dedicated to holding only cleaned masks. Thus, contamination of a mask that has been cleaned is avoided by not storing the cleaned mask in a carrier that has held unclean masks.

As with end effectors, contact pads, and buffer stations, the inventors of the present application have determined that before a mask is cleaned, potentially contaminating particles are transferable from the mask to a carrier when the unclean mask is held in the carrier. Further, these particles can then be transferred again from the carrier to a subsequently held mask. If the mask has already undergone a cleaning process, the particle transfer back to the mask from the carrier can contaminate the clean mask. Thus, one or more embodiments provided herein avoid this potential for contamination by only holding a clean mask in a carrier that has not held unclean masks.

Finally, the system 100 includes a controller 120 (e.g., a programmed processor) adapted to execute instructions to implement the functions and methods described herein. The controller 120 can be implemented as a single processor operatively coupled to each of the components to control their operation or the controller 120 can be implemented as multiple processors, one for each component, in communication with each other and/or with an electronic device manufacturing facility automation system.

Figure 2:
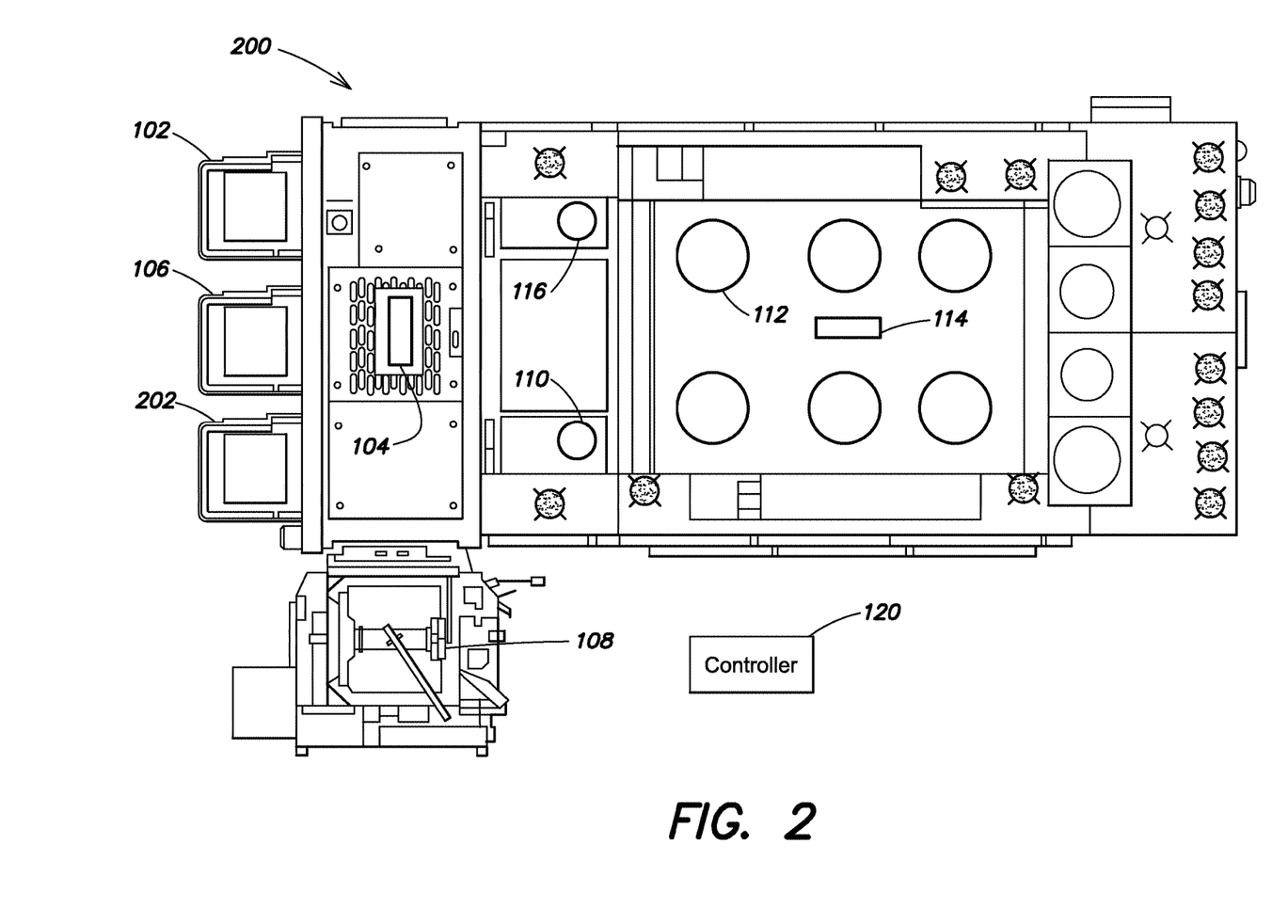
FIG. 2 is a schematic depiction of a second example system for improved mask processing according to some embodiments provided herein.

FIG. 2 is a schematic diagram of a second example system 200 provided in accordance with some embodiments. As with the first example system 100, a first load port 102 is coupled to the factory interface of a mask processing tool such as a mask cleaning tool. The load port 102 is disposed so that an atmospheric dual blade factory interface robot 104 can remove the mask to be cleaned from a carrier placed in the load port 102. Thus, the carrier is opened into a non-vacuum factory interface. The robot 104 includes two end effectors. The first end effector is dedicated to only handling masks that have not yet been cleaned. The second end effector is dedicated to only handing masks that have already been cleaned. Thus, contamination of a mask that has been cleaned is avoided by not handling the clean mask with an end effector that has handled unclean masks.

The system 200 further includes two mask inverters 106, 202. In some embodiments, the mask inverters 106, 202 can be disposed at load port locations as shown in FIG. 2. In some embodiments, the mask inverters can be located at any practicable locations such as alongside the factory interface or between the tool and the factory interface within the system 200. The mask inverters 106, 202 include contact pads for holding the mask when the mask is inverted. One mask inverter 106 is dedicated to only handling and inverting masks that have not yet been cleaned. The second mask inverter 202 is dedicated to only handing masks that have already been cleaned. Thus, contamination of a mask that has been cleaned is avoided by not handling the clean mask with a mask inverter that has held unclean masks.

As with the first example system 100, the system 200 can further include a dry clean tool 108 such as an etch process tool for, e.g., removing oxidation from the mask before the mask under goes wet clean processing. An example of such a tool is the Axiom™ strip chamber manufactured by Applied Materials, Inc. of Santa Clara, Calif.

As with the first example system 100, in some embodiments, the system 200 can include buffer stations 110, 116 within an intermediate module between the factory interface and an atmospheric process module that includes a plurality of mask wet clean chambers 112. The buffer stations 110, 116 provide a location for the factory interface robot 104 and an atmospheric dual blade process robot 114 to facilitate mask handoff. One of the buffer stations 110 is dedicated to holding unclean masks while the other buffer station 116 is dedicated to holding cleaned masks. Thus, contamination of a mask that has been cleaned is avoided by not storing the clean mask on a buffer station that has held unclean masks.

As with the first example system 100, in some embodiments, the system 100 can include a second load port (not shown) coupled to the factory interface. The second load port can be disposed so that the atmospheric dual blade factory interface robot 104 can load a cleaned mask into a carrier placed in the second load port.

As with the first example system 100, in some embodiments, a second load port is not used and instead, cleaned masks exit the system via the first load port 102. In such embodiments, a first carrier that brings the unclean mask to the system 100 is replaced with a second carrier to remove the cleaned mask from the system 100. In other words, after a mask to be cleaned has been removed from the carrier within which the unclean mask arrived, the carrier is removed from the load port 102 and a new carrier that has not stored unclean masks is placed on the load port 102 to receive the clean mask. Therefore, some of the carriers used by the system are dedicated to holding only unclean masks while other carriers are dedicated to holding only cleaned masks. Thus, contamination of a mask that has been cleaned is avoided by not storing the cleaned mask in a carrier that has held unclean masks.

Finally, as with the first example system 100, the system 200 includes a controller 120 (e.g., a programmed processor) adapted to execute instructions to implement the functions and methods described herein. The controller 120 can be implemented as a single processor operatively coupled to each of the components to control their operation or the controller 120 can be implemented as multiple processors, one for each component, in communication with each other and/or with an electronic device manufacturing facility automation system.

Figure 3:
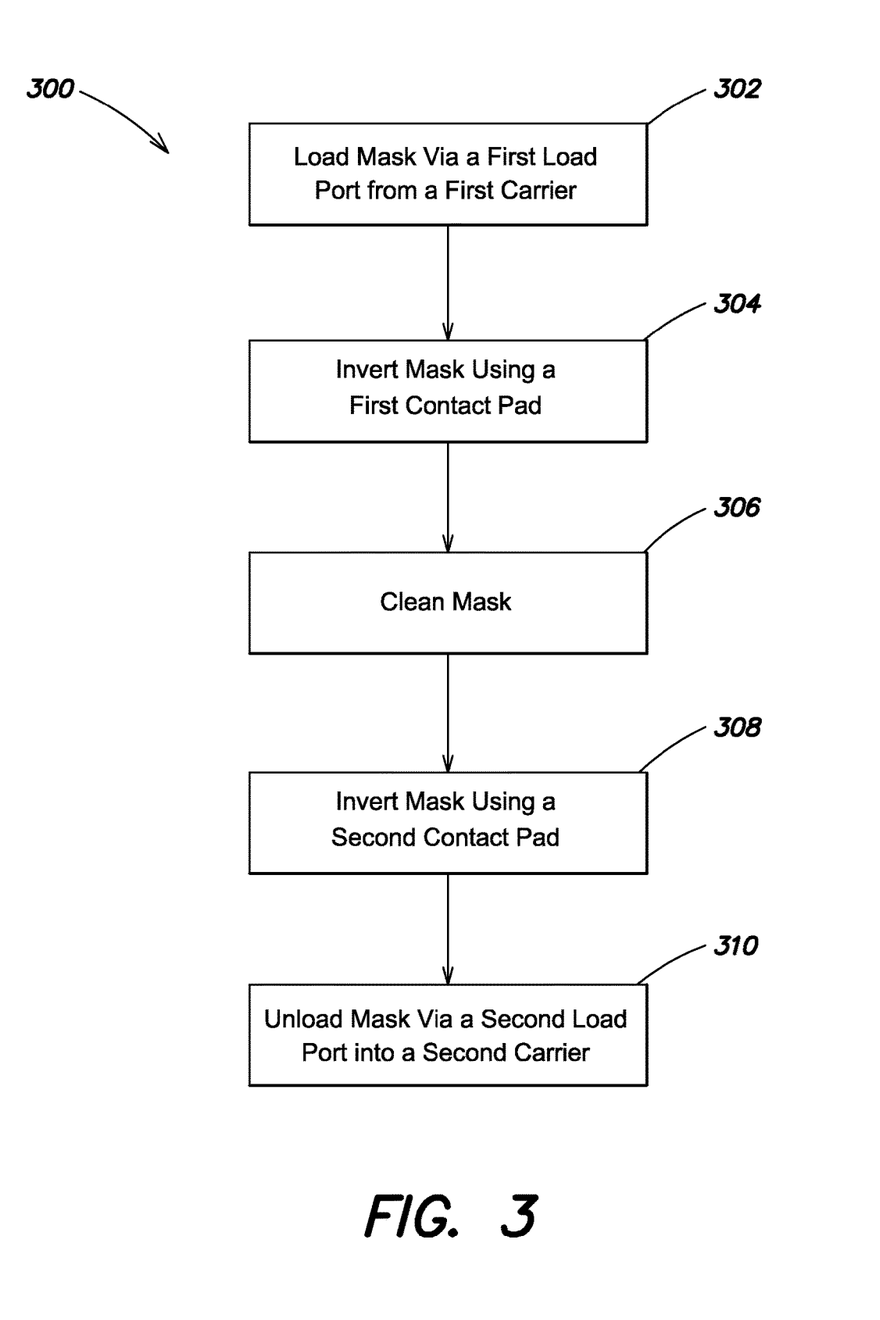
FIG. 3 is a flow chart depicting a first example method for improved mask processing according to some embodiments provided herein.

FIG. 3 is a flowchart of a first example method 300 provided in accordance with some embodiments. A mask to be cleaned is loaded via a first load port from a first carrier (302). A first end effector of an atmospheric dual blade factory interface robot can be used. The mask is then loaded onto a first contact pad of an inverter with two sets of contact pads and then inverted (304). In some embodiments, the mask can be loaded into a first inverter with a single contact pad.

The mask is then cleaned (306). Cleaning the mask can include putting the mask through a dry clean process chamber and/or a wet clean process chamber. End effectors and buffer stations used to handle the mask can include end effectors and buffer stations dedicated to handling the mask before the cleaning process and separate end effectors and buffer stations dedicated to handling the mask after the cleaning process.

After the mask has been cleaned, the mask is transferred to a second contact pad of the inverter and the mask is inverted (308). In some embodiments, a second inverter is used in place of an inverter with two contact pads. An end effector that has not handled unclean masks is then used to transfer the mask from the inverter to a second carrier in a second load port to unload the mask from the system (310).

Figure 4:
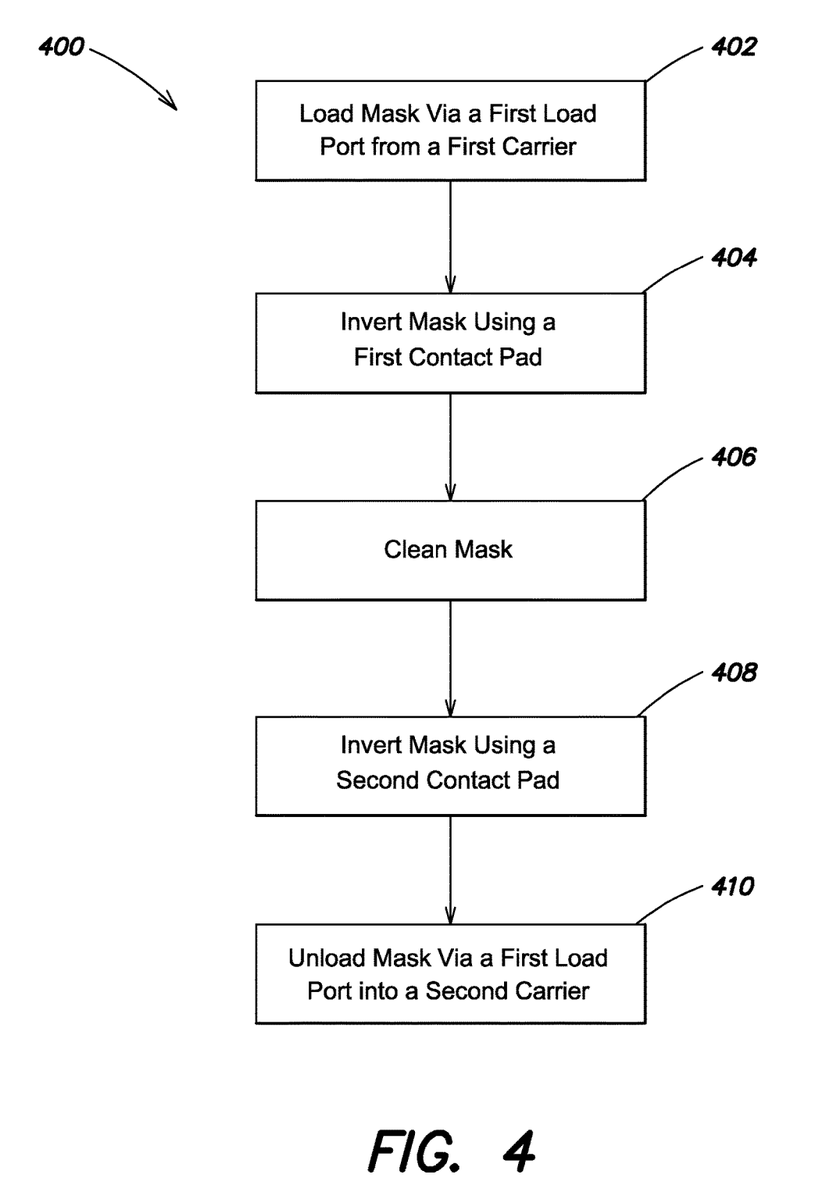
FIG. 4 is a flow chart depicting a second example method for improved mask processing according to some embodiments provided herein.

FIG. 4 is a flowchart of a second example method 400 provided in accordance with some embodiments. A mask to be cleaned is loaded via a first load port from a first carrier (402). A first end effector of an atmospheric dual blade factory interface robot can be used. After the mask has been loaded, the first carrier is removed from the first load port and replaced with a second carrier. The mask is loaded onto a first contact pad of an inverter with two sets of contact pads and then inverted (404). In some embodiments, the mask can be loaded into a first inverter with a single contact pad.

The mask is then cleaned (406). Cleaning the mask can include putting the mask through a dry clean process chamber and/or a wet clean process chamber. End effectors and buffer stations used to handle the mask can include end effectors and buffer stations dedicated to handling the mask before the cleaning process and separate end effectors and buffer stations dedicated to handling the mask after the cleaning process.

After the mask has been cleaned, the mask is transferred to a second contact pad of the inverter and the mask is inverted (408). In some embodiments, a second inverter is used in place of an inverter with two contact pads. An end effector that has not handled unclean masks is then used to transfer the mask from the inverter to the second carrier waiting in the first load port to unload the mask from the system (410).

In some embodiments, the above methods 300, 400 may include a fault recovery process. For example, at any stage of the methods 300, 400, in response to a fault (e.g., an alert message indicating the failure of a component has been detected), the system can transfer a mask to the first or second load port based upon the status of the mask. In other words, if a mask has not undergone a complete cleaning process, the system will return the mask to the first (e.g., in-coming) load port using end effectors and buffer stations that are dedicated to handling unclean masks. Further, if a mask has undergone a complete cleaning process, the system will bring the mask to the second (e.g., out-going) load port using end effectors and buffer stations that are dedicated to handling cleaned masks. In embodiments where only one load port is used, the system can request a carrier that corresponds to the status of the mask. In other words, if the mask has not undergone a complete cleaning process, the system will request a carrier that holds unclean masks to be placed at the load port and if a mask has undergone a complete cleaning process, the system will request a carrier that holds only clean masks to be placed at the load port.

The foregoing description discloses only example embodiments of the invention. Modifications of the above disclosed apparatus and methods which fall within the scope of the invention will be readily apparent to those of ordinary skill in the art.

Figure 5:
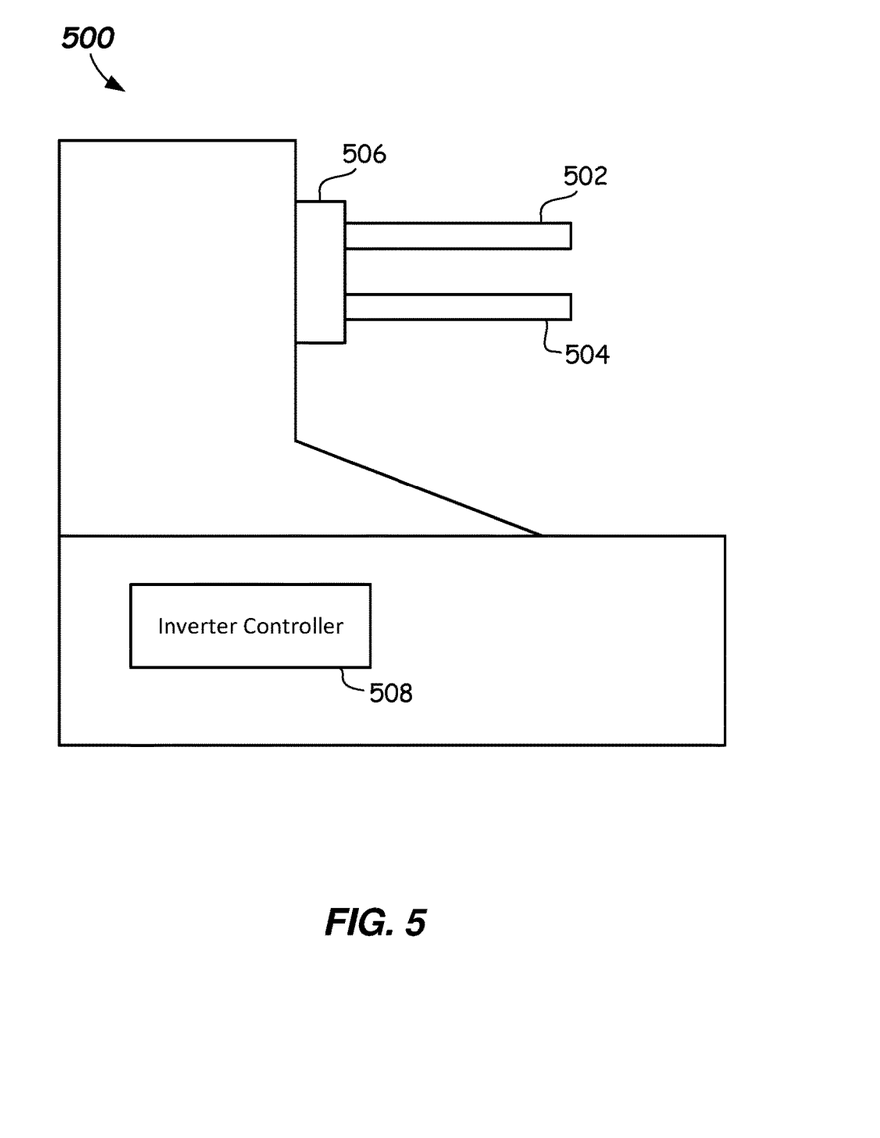
FIG. 5 illustrates a schematic depiction of an apparatus for inverting a mask according to embodiments provided herein.

The mask inverter 500 further includes one or more actuators 506 that are operable to invert the contact pads 502, 504. In some embodiments, the actuators 506 can include a single mechanism that inverts both contact pads 502, 504 concurrently. In some embodiments, the actuators 506 can include two or more mechanisms operable to invert the contact pads 502, 504 independently of each other.

Finally, the mask inverter 500 can include a controller 508 (e.g., a programmed processor) coupled to the actuators 506 (and contact pad sensors) and adapted to execute instructions to help implement the functions and methods described herein. For example, in operation, the controller 508 can receive feedback from the sensors that a mask is present on one of the contact pads. In response, the controller 508 can control the contact pad to activate an electro-static chuck and control the actuators 506 to invert the contact pad holding the mask.

Accordingly, while the present invention has been disclosed in connection with example embodiments thereof, it should be understood that other embodiments may fall within the spirit and scope of the invention, as defined by the following claims.

The invention claimed is:

1. A method of operating a system for cleaning masks, comprising:
   providing the system for cleaning masks, the system comprising a dry clean tool, a wet clean chamber, and a mask inverter having one or more actuators, a first contact pad configured to engage with at least one of the one or more actuators, and a second contact pad configured to engage with at least one of the one or more actuators;
   loading an uncleaned mask via a first load port of the system from a first carrier to the mask inverter, wherein the first load port is dedicated to uncleaned masks;
   inverting the uncleaned mask using the first contact pad of the mask inverter, wherein the first contact pad is dedicated to uncleaned masks;
   performing a dry cleaning operation on the uncleaned mask in the dry clean tool to produce a dry cleaned mask;
   performing a wet cleaning operation on the dry cleaned mask in the wet clean chamber to produce a cleaned mask;
   inverting the cleaned mask using the second contact pad of the mask inverter, wherein the second contact pad is dedicated to cleaned masks;
   unloading the cleaned mask via a second load port into a second carrier, wherein the second load port is dedicated to cleaned masks;
   detecting a system fault at any stage during the dry cleaning operation and the wet cleaning operation;
   transferring the uncleaned mask or the dry cleaned mask to the first load port if the system fault is detected prior to completion of the dry cleaning operation and the wet cleaning operation; and
   transferring the cleaned mask to the second load port if the system fault is detected after the mask has completed both the dry cleaning operation and the wet cleaning operation;
   wherein the at least one actuator of the one or more actuators inverts the first contact pad and the second contact pad concurrently.

2. The method of claim 1 further comprising handling the uncleaned mask using a first portion of an atmospheric dual blade robot that is dedicated to handling uncleaned masks, and handling the cleaned mask using a second portion of the atmospheric dual blade robot that is dedicated to handling cleaned masks,
   wherein the dry cleaning operation comprises removing oxidation from the uncleaned mask.

3. The method of claim 1 further comprising transferring the uncleaned mask using a first mask handoff buffer station and transferring the cleaned mask using a second mask handoff buffer station;
   wherein the first mask handoff buffer station is dedicated to uncleaned masks, and the second mask handoff buffer station is dedicated to cleaned masks,
   wherein the dry clean tool comprises an etch process tool.

4. The method of claim 1 further comprising handling the uncleaned mask using a first portion of an atmospheric dual blade robot that is dedicated to handling uncleaned masks, and handling the cleaned mask using a second portion of the atmospheric dual blade robot that is dedicated to handling cleaned masks.

5. A method of operating a system for cleaning masks, comprising:
   providing the system for cleaning masks, the system comprising a dry clean tool, a wet clean chamber, and a mask inverter having one or more actuators, a first contact pad configured to engage with at least one of the one or more actuators, and a second contact pad configured to engage with at least one of the one or more actuators;
   loading an uncleaned mask via a first load port of the system from a first carrier to the mask inverter, wherein the first carrier is dedicated to uncleaned masks;
   inverting the uncleaned mask using the first contact pad of the mask inverter;
   performing a dry cleaning operation on the uncleaned mask in the dry clean tool to produce a dry cleaned mask;
   performing a wet cleaning operation on the dry cleaned mask in the wet clean chamber to produce a cleaned mask;
   inverting the cleaned mask using the second contact pad of the mask inverter;
   unloading the cleaned mask via a second load port into a second carrier dedicated to cleaned masks;
   detecting a system fault at any stage during the dry cleaning operation and the wet cleaning operation;
   transferring the uncleaned or dry cleaned mask to the first carrier at the first load port if the system fault is detected prior to completion of the dry cleaning operation and the wet cleaning operation; and
   transferring the cleaned mask to the second carrier of the second load port if the system fault is detected after the mask has completed both the dry cleaning operation and the wet cleaning operation;
   wherein the first contact pad and the second contact pad are inverted concurrently.

6. The method of claim 5 further comprising handling the uncleaned mask using a first portion of an atmospheric dual blade robot that is dedicated to handling uncleaned masks, and handling the cleaned mask using a second portion of the atmospheric dual blade robot that is dedicated to handling cleaned masks.

7. The method of claim 5 further comprising transferring the uncleaned mask using a first mask handoff buffer station, and transferring the cleaned mask using a second mask handoff buffer station;
   wherein the first mask handoff buffer station is dedicated to uncleaned masks and the second mask handoff buffer station is dedicated to cleaned masks.

8. A method of operating a system for cleaning masks, comprising:
   providing the system for cleaning masks, the system comprising a dry clean tool, a wet clean chamber, and a mask inverter having one or more actuators, a first contact pad configured to engage with at least one of the one or more actuators, and a second contact pad configured to engage with at least one of the one or more actuators;
   loading, by a first dual blade robot, an uncleaned mask via a first load port from a first carrier to the mask inverter, wherein the first load port is dedicated to uncleaned masks;
   inverting the uncleaned mask using the first contact pad of the mask inverter, wherein the first contact pad is dedicated to uncleaned masks;
   performing a dry clean operation on the uncleaned mask in the dry clean tool to produce a dry cleaned mask;
   performing a wet cleaning on the dry cleaned mask in the wet clean chamber to produce a cleaned mask;
   inverting the cleaned mask using the second contact pad of the mask inverter, wherein the second contact pad is dedicated to cleaned masks;
   unloading, by the first dual blade robot, the cleaned mask via a second load port of the system into a second carrier, wherein the second load port is dedicated to cleaned masks;
   detecting a system fault at any stage during the dry cleaning operation and wet cleaning operation;
   transferring the uncleaned or dry cleaned mask to the first load port if the system fault is detected prior to completion of the dry cleaning operation and the wet cleaning operation; and
   transferring the cleaned mask to the second load port if the system fault is detected after the mask has completed both the dry cleaning operation and the wet cleaning operation;
   wherein the one or more actuators invert the first contact pad and the second contact pad independently of each other.

9. The method of claim 8 further comprising:
   transferring, by a second dual blade robot, the uncleaned mask using a first mask handoff buffer station and transferring, by the second dual blade robot, the cleaned mask using a second mask handoff buffer station;
   wherein the first mask handoff buffer station is dedicated to uncleaned masks, and the second mask handoff buffer station is dedicated to cleaned masks.

* * * * *